United States Patent
Hasegawa et al.

(10) Patent No.: US 7,781,360 B2
(45) Date of Patent: Aug. 24, 2010

(54) DIELECTRIC PORCELAIN COMPOSITION AND ELECTRONIC COMPONENT

(75) Inventors: Tomoyuki Hasegawa, Saku (JP); Yoshinori Ide, Minami-Saku Gun (JP); Tadashi Otagiri, Nagoya (JP)

(73) Assignees: NGK Insulators, Ltd., Nagoya-Shi (JP); Soshin Electric Co., Ltd., Saku-Shi (JP)

( * ) Notice: Subject to any disclaimer, the term of this patent is extended or adjusted under 35 U.S.C. 154(b) by 0 days.

(21) Appl. No.: 12/204,006

(22) Filed: Sep. 4, 2008

(65) Prior Publication Data

US 2009/0011923 A1    Jan. 8, 2009

Related U.S. Application Data

(63) Continuation of application No. PCT/JP2007/055781, filed on Mar. 14, 2007.

(30) Foreign Application Priority Data

Mar. 30, 2006 (JP) ............................. 2006-093579
Aug. 31, 2006 (JP) ............................. 2006-235529

(51) Int. Cl.
*C04B 35/468* (2006.01)
(52) U.S. Cl. ....................... 501/138; 501/139
(58) Field of Classification Search ................. 501/138, 501/139
See application file for complete search history.

(56) References Cited

U.S. PATENT DOCUMENTS

| | | | |
|---|---|---|---|
| 4,222,885 A | 9/1980 | Hennings et al. | |
| 4,459,364 A * | 7/1984 | McSweeney et al. | 501/137 |
| 4,764,494 A | 8/1988 | Sakabe et al. | |
| 5,571,761 A * | 11/1996 | Kumagai et al. | 501/134 |
| 5,945,030 A | 8/1999 | Kimura et al. | |
| 5,954,994 A | 9/1999 | Kimura et al. | |
| 6,080,327 A | 6/2000 | Takenaka et al. | |
| 6,083,415 A | 7/2000 | Kimura et al. | |
| 6,107,228 A * | 8/2000 | Sugimoto et al. | 501/139 |
| 6,251,816 B1 * | 6/2001 | Maher et al. | 501/138 |
| 6,310,761 B1 | 10/2001 | Hori et al. | |
| 6,642,167 B1 * | 11/2003 | Sugimoto et al. | 501/138 |

(Continued)

FOREIGN PATENT DOCUMENTS

DE    102 45 106 A1    4/2004

(Continued)

OTHER PUBLICATIONS

Applicants statement of relevance of Tomoyuki Hasegawa et al, "Dielectric Properties and Microstructures of Low-Temperature Sintered Ba-TiO3 Ceramics with CuBi2O4 Sintering Aid", The proceedings of the meeting of Ferroelectric Materials and their Applications, 23rd Meeting on May 24-26, 2006, Article 24-F-3.*

(Continued)

*Primary Examiner*—Karl E Group
(74) *Attorney, Agent, or Firm*—Burr & Brown (57) ABSTRACT

The present invention provides a dielectric porcelain composition comprising 100 parts by weight of a barium titanate-based dielectric material and 4 to 10 parts by weight in total of $Bi_2O_3$ and at least one compound selected from the group of consisting of CuO, ZnO and MgO.

11 Claims, 1 Drawing Sheet

U.S. PATENT DOCUMENTS

| | | | |
|---|---|---|---|
| 6,740,614 B2 * | 5/2004 | Kim et al. | 501/139 |
| 2002/0098968 A1 | 7/2002 | Takahashi et al. | |
| 2009/0141427 A1 * | 6/2009 | Lyoo et al. | 361/321.4 |

FOREIGN PATENT DOCUMENTS

| EP | 0 637 041 A2 | 2/1995 |
|---|---|---|
| EP | 0 740 310 A1 | 10/1996 |
| EP | 1 724 244 A1 | 11/2006 |
| JP | 01-192762 A1 | 8/1989 |
| JP | 05-120915 A1 | 5/1993 |
| JP | 05-234420 A1 | 9/1993 |
| JP | 05234420 * | 9/1993 |
| JP | 10-297969 A1 | 11/1998 |
| JP | 11-029356 A1 | 2/1999 |
| JP | 11-228226 A1 | 8/1999 |
| JP | 11-228228 A1 | 8/1999 |
| JP | 11-278926 A1 | 12/1999 |
| JP | 2000-169221 A1 | 6/2000 |
| JP | 2000-226255 A1 | 8/2000 |
| JP | 2000-264724 A1 | 9/2000 |
| JP | 2001-143955 A1 | 5/2001 |
| JP | 2001-247365 A1 | 9/2001 |
| JP | 2002-160967 A1 | 6/2002 |
| JP | 2002-173368 A1 | 6/2002 |
| JP | 2002-265262 A1 | 9/2002 |
| JP | 2003-238240 A1 | 8/2003 |
| JP | 2003-335575 A1 | 11/2003 |
| WO | 01/97254 A1 | 12/2001 |
| WO | 03/004436 A1 | 1/2003 |
| WO | 2005/085154 A1 | 9/2005 |

OTHER PUBLICATIONS

U.S. Appl. No. 12/283,125, filed Sep. 9, 2008, Oobuchi, et al.

Tomoyuki Hasegawa et al., "*Dielectric Properties and Microstructures of Low-Temperature-Sintered $Ba$-$TiO_3$-Based Ceramics with $CuBi_2O_4$ Sintering Aid*," reprinted from Japanese Journal of Applied Physics, 2006, vol. 45, No. 9B, pp. 7360-7364.

* cited by examiner

DIELECTRIC PORCELAIN COMPOSITION AND ELECTRONIC COMPONENT

FIELD OF THE INVENTION

The present invention relates to a dielectric porcelain composition, for example, a barium titanate-based dielectric porcelain composition, which is suitably used for manufacturing of a ceramic multilayer substrate or laminated piezoelectric element by use of low temperature co-fired ceramic (LTCC).

BACKGROUND OF THE INVENTION

In recent years, it is designed to attain miniaturization and density growth of electronic equipment by integrating a passive part such as a capacitor or inductor which was conventionally mounted on a ceramic substrate surface into a ceramic multilayer substrate. Such a ceramic multilayer substrate is produced by forming a green sheet from a slurry of a dielectric porcelain composition and an organic solvent by doctor blade method followed by drying, printing a wiring conductor on the top surface of the sheet, forming a laminated body by laminating such green sheets of the same dielectric porcelain composition as described above, and co-firing it.

Such a ceramic multilayer substrate uses Ag or Cu with small specific resistance as the wiring conductor for performing high-performance signal processing at high speed. Therefore, various ceramic materials which can be co-fired with Ag and Cu at temperatures lower than 962° C. that is the melting point of Ag and 1084° C. that is the melting point of Cu are developed.

In the above-mentioned ceramic multilayer substrate, a one having a dielectric constant of 10 or less is suitably used for suppressing stray capacitance or coupling capacitance between wires. While, when a capacitor is formed within the ceramic multilayer substrate, it is desirable for the ceramics constituting the capacitor to have a high dielectric constant.

The barium titanate-based dielectric porcelain composition generally has a high dielectric constant, and can form a high-capacity capacitor within the ceramic multilayer substrate. However, since it needs a sintering temperature as high as 1150 to 1200° C. or higher, Ag and Cu cannot be used as the wiring conductor to be co-fired. Therefore, it is necessary for the barium titanate-based dielectric porcelain composition to be sinterable at a temperature of 1000° C. or lower while having practical dielectric constant and dielectric loss.

On the other hand, in use as a piezoelectric element, development of a piezoelectric material having a lead-free composition is demanded since conventional PZT contains lead that is an environmental load substance, and the barium titanate-based porcelain composition is attracting attention as a candidate thereof.

Further, in use as a laminated piezoelectric element through molding of sheets by the doctor blade method, it is important to develop a low-temperature sintering technique capable of suppressing use of expensive Pt or Pd. However, lead-free piezoelectric porcelain compositions disclosed in the past need firing temperatures of 1000° C. or higher.

Various prior literatures are known for the barium titanate-based dielectric porcelain composition. In Japanese Patent Application Laid-Open No. Hei 5-120915A, lead is added to allow low-temperature firing.

Japanese Patent Application Laid-Open No. Sho 54-53300A describes addition of copper oxide and bismuth oxide.

Japanese Patent Application Laid-Open No. Sho 61-251561A describes addition of copper oxide.

Further, in Japanese Patent Application Laid-Open Nos. 2001-143955A, 2000-226255A, 2000-264724A and 2003-335575A, barium titanate-based dielectric porcelain compositions are disclosed.

Lead-free piezoelectric porcelain compositions are disclosed, for example, in Japanese Patent Application Laid-Open Nos. Hei 11-228226A, Hei 11-228228A, and Hei 10-297969A, Japanese Patent No. 2942535A, and Japanese Patent Application Laid-Open Nos. Hei 11-29356A, 2002-160967A and 2002-265262A.

SUMMARY OF THE INVENTION

However, the dielectric porcelain compositions according to the related art are not desirable from the viewpoint of the environmental load of lead, since lead is contained as an essential component. Otherwise, even if low-temperature sintering is possible, the resulting dielectric porcelain composition is low in electric characteristic, for example, with a dielectric constant of 1000 or less and an increasing trend of dielectric loss, and thus insufficient for practical use. A lead-free piezoelectric porcelain material which can be compactly sintered at a low temperature of 1000° C. or lower has not been provided yet.

An object of the present invention is thus to provide a new barium titanate-based dielectric porcelain composition, which can be sintered at a temperature of 1000° C. or lower.

The present invention provides a dielectric porcelain composition having a composition comprising 100 parts by weight of a barium titanate-based dielectric material and 4 to 10 parts by weight in total of $Bi_2O_3$ and at least one compound selected from the group consisting of CuO, ZnO and MgO as sub-components. The molar ratio of the total amount of at least one compound selected from the group consisting of CuO, ZnO and MgO to $Bi_2O_3$ ranges from 1.5:1.0 to 1.0:5.0.

The present invention also relates to an electronic part comprising this dielectric porcelain composition.

According to the present invention, a barium titanate-based dielectric porcelain composition which can be sintered at a temperature of 1000° C. or lower can be provided. This dielectric porcelain composition is a breakthrough composition without needing not only inclusion of a component such that it excessively loads on the environment such as lead, but also addition of a glass component for reducing the sintering temperature.

By using the dielectric porcelain composition of the present invention, a conductive film composed of a metal having a relatively low baking temperature such as silver can be co-fired with the dielectric porcelain composition, whereby various electronic parts which were conventionally difficult to manufacture can be provided. To this extent, the present invention has an extremely great industrial advantage.

DETAILED DESCRIPTION OF THE INVENTION

It becomes increasingly important to integrate a high-capacity passive part into an electronic part, for example, in a LTCC material using Ag conductor. The present invention enables industrial manufacturing of such an electronic part to put into a new product into the market.

Further, the present invention is advantageously applicable to a purpose needing piezoelectric porcelain such as a laminated piezoelectric actuator since lead-free, low temperature-sinterable piezoelectric porcelain can be provided by the present invention.

In the dielectric porcelain composition of the present invention, the dielectric constant thereof is not particularly limited. However, in a purpose needing a high dielectric constant such as a dielectric capacitor, it is preferred to set the dielectric constant to, for example, 1000 or more.

The barium titanate-based dielectric material referred to herein means a dielectric material mainly composed of barium titanate. Concretely, it can be, in the raw material stage, a calcined body of barium titanate or a mixture of titanium oxide and barium oxide which produce barium titanate after sintering. When the whole barium titanate-based dielectric material is 100 mol %, 100 mol % may be entirely composed of barium titanate. Otherwise, 30 mol % or less of the barium portion of the dielectric material can be substituted by strontium, calcium or magnesium. Further, 30 mol % or less of the titanium portion of the dielectric material can be substituted by zirconium.

In the main component 100 mol %, 0 to 30 mol % can be substituted by at least one compound selected from the group consisting of $SrTiO_3$, $CaTiO_3$, $MgTiO_3$ and $BaZrO_3$.

In the present invention, the dielectric porcelain composition has a composition including 4 to 10 parts by weight in total of $Bi_2O_3$ and at least one compound selected from the group consisting of CuO, ZnO and MgO as sub-components. The sub-components are added as follows in the stage of raw material mixture.

(1) $Bi_2O_3$ and at least one compound selected from the group consisting of CuO, ZnO and MgO and are added together in the form of different oxides (2) A composite oxide of $Bi_2O_3$ and at least one compound selected from the group consisting of CuO, ZnO and MgO is added.

(3) Both two or more kinds of oxides in (1) and the composite oxide in (2) are added.

The composite oxides in (2) and (3) can be produced by calcination. As the composition oxide, $CuBi_2O_4$ can be given as an example.

The total amount of $Bi_2O_3$ and at least one compound selected from the group consisting of CuO, ZnO and MgO is controlled to 4 parts by weight or more, whereby the dielectric constant of porcelain when fired at 1000° C. or lower can be improved, for example, to 1000 or more. The dielectric loss can be also reduced. From the viewpoint of improving the dielectric constant, the total amount of the sub-components is controlled preferably to 4.5 parts by weight or more, more preferably to 5.0 parts by weight or more.

The dielectric constant of the porcelain is improved also by controlling the total amount of the sub-components to 10.0 parts by weight or less. From this point of view, the total amount of the sub-components is controlled preferably to 9.0 parts by weight or less.

The molar ratio of the total amount of at least one compound selected from the group consisting of CuO, ZnO and MgO to $Bi_2O_3$ (the total amount of at least one compound selected from the group consisting of CuO, ZnO and MgO: $Bi_2O_3$) is set within the range of 1.5:1.0 to 1.0:5.0. The range is further preferably 1.5:1.0 to 1.0:2.0. According to this, the dielectric constant of porcelain can be further improved with further reduction in dielectric loss, and low-temperature firing at 1000° C. or lower can be performed.

The dielectric porcelain composition of the present invention is preferably sintered at a temperature of 900 to 1000° C. Sintering is difficult at a temperature below 900° C. By setting the sintering temperature to 1000° C. or lower, extensive development of the purposes as described above can be attained with a great industrial advantage. The sintering temperature is further preferably 980° C. or lower. When Ag is used as the conductor, it is preferred to set the sintering temperature to 950° C. or lower.

When the porcelain composition of the present invention is used as a capacitor, a means for improving dielectric characteristic by composition control of high-temperature firing $BaTiO_3$ is also applicable thereto. For example, by firing at 1000° C. or lower depending on the kind of additives, X7R characteristic of EIA standard and B characteristic of JIS standard can be satisfied with a dielectric constant at room temperature ranging from 1000 to 4000.

In a preferred embodiment, one or more compounds selected from the group consisting of ZnO, $Nb_2O_5$ and MnO are added in a total amount of 0.1 part by weight or more and 1.5 parts by weight or less. According to this, the X7R characteristic of EIA standard or the B characteristic of JIS standard can be satisfied. These characteristics, which are standards related to the electrostatic capacitance of the dielectric porcelain composition and consequently temperature characteristic of electronic part performance, are advantageous for extensive development as electronic parts.

From the point of improving the temperature characteristic of electrostatic capacitance of the dielectric porcelain composition, the total added amount of the one or more compounds selected from the group consisting of ZnO, $Nb_2O_5$ and MnO further preferably may be 0.2 part by weight or more, or, 1.2 parts by weight or less.

The dielectric porcelain composition of the present invention can have a dielectric constant at 25° C. of 1000 or more. The upper limit thereof is not particularly limited, but is generally apt to be 4000 or less. The dielectric loss at 25° C. can be reduced to 5% or less.

It is preferred that the dielectric porcelain composition of the present invention substantially contains no oxide of Pb, except traces of unavoidable impurities.

In a preferred embodiment, the dielectric porcelain composition includes 4 to 10 parts by weight in total of CuO and $Bi_2O_3$ as the sub-components. According to this, development of piezoelectricity is facilitated in the dielectric porcelain composition of the present invention. From the point of the piezoelectricity, CuO is the most preferred among the above-mentioned three kinds of sub-components.

When the dielectric porcelain of the present invention is used as piezoelectric porcelain, it is preferred that the piezoelectric constant is 10 or more although it is not particularly limited. In such a use, the dielectric constant does not have to be high as in the use as dielectric capacitor.

From the point of the piezoelectricity, it is preferred to control the amount of ZnO to 0.1 part by weight or less. From this point of view, it is further preferred that ZnO is not substantially contained (in this case, also, unavoidable impurities are allowable).

From the point of the piezoelectricity, it is preferred to control the amount of MgO to 0.1 part by weight or less. From this point of view, it is further preferred that MgO is not substantially contained (in this case, also unavoidable impurities are allowable).

In a preferred embodiment, MnO is added to the dielectric porcelain composition in an amount of 0.02 part by weight or more and 0.2 part by weight or less. According to this, the piezoelectricity of the dielectric porcelain composition of the present invention can be further enhanced. From the point of the improvement in piezoelectricity, the amount of MnO is controlled preferably to 0.05 part by weight or more. From the point of the improvement in piezoelectricity, the amount of MnO is controlled preferably to 0.15 part by weight or less, further preferably to 0.1 part by weight or less.

In a preferred embodiment, lithium is added to the dielectric porcelain composition in an amount of 0.05 part by weight or more and 0.3 part by weight or less in terms of $Li_2CO_3$. According to this, the piezoelectricity of the dielectric porcelain composition can be further enhanced. From the point of the improvement in piezoelectricity, the amount of $Li_2CO_3$ is controlled preferably to 0.2 part by weight or less, further preferably to 0.15 part by weight or less.

In a preferred embodiment, the added amount (total value) of MnO amount and $Li_2CO_3$-converted amount to the dielectric porcelain composition is 0.05 part by weight or more and 0.6 part by weight or less. According to this, the piezoelectricity of the dielectric porcelain composition can be further enhanced. From the point of the improvement in piezoelectricity, the total amount of the both is controlled preferably to 0.1 part by weight or more. From the point of the improvement in piezoelectricity, the total added amount of the both is controlled preferably to 0.3 part by weight or less, further preferably to 0.2 part by weight.

The electronic part of the present invention comprises the above-mentioned dielectric porcelain composition. Particularly preferably, the electronic part comprises a low-temperature sinterable conductive film composed of Ag, Cu or Ag—Pd alloy.

Preferably, the composition substantially contains no glass component.

As the raw material of each metal component, for example, oxide, nitrate, carbonate and sulfate of each metal can be used.

In the present invention, the ratio of each metal oxide component is an equivalent for each metal oxide in the raw material mixture. The equivalent for each metal oxide in the raw material mixture is determined by the mixing ratio of each metal raw material. In the present invention, the mixing ratio of each metal raw material is weighed by a precision scale, and the equivalent is calculated based on the weighed value.

The electronic part that is the object of the invention is not particularly limited, and examples thereof include a laminated ceramic capacitor, a multilayer wiring board, a dielectric composite module, and a laminated piezoelectric actuator.

The dielectric porcelain composition of the present invention can be integrated with the other low-dielectric constant dielectric porcelain composition having a dielectric constant $\epsilon$ of 150 or less. As the composition system of low-temperature fired porcelain constituting the other dielectric layer, the followings are particularly preferred:

$BaO\text{—}TiO_2\text{—}ZnO$ $BaO\text{—}TiO_2\text{—}Bi_2O_3\text{—}Nd_2O_3$ $BaO\text{—}TiO_2\text{—}Bi_2O_3\text{—}La_2O_3\text{—}Sm_2O_3$ $BaO\text{—}Al_2O_3\text{—}SiO_2\text{—}ZnO$.

When the dielectric porcelain composition of the present invention is produced, preferably, each metal component raw material is mixed at a predetermined ratio, the resulting mixed powder is calcined at 900 to 1200° C., and the calcined body is pulverized to give ceramic powder. The ceramic powder is preferably granulated while mixing with an appropriate binder such as polyvinyl alcohol, and the granulated powder is molded. The resulting molded body is fired at 900 to 1000° C. to thereby obtain the dielectric porcelain composition.

Figure 1:
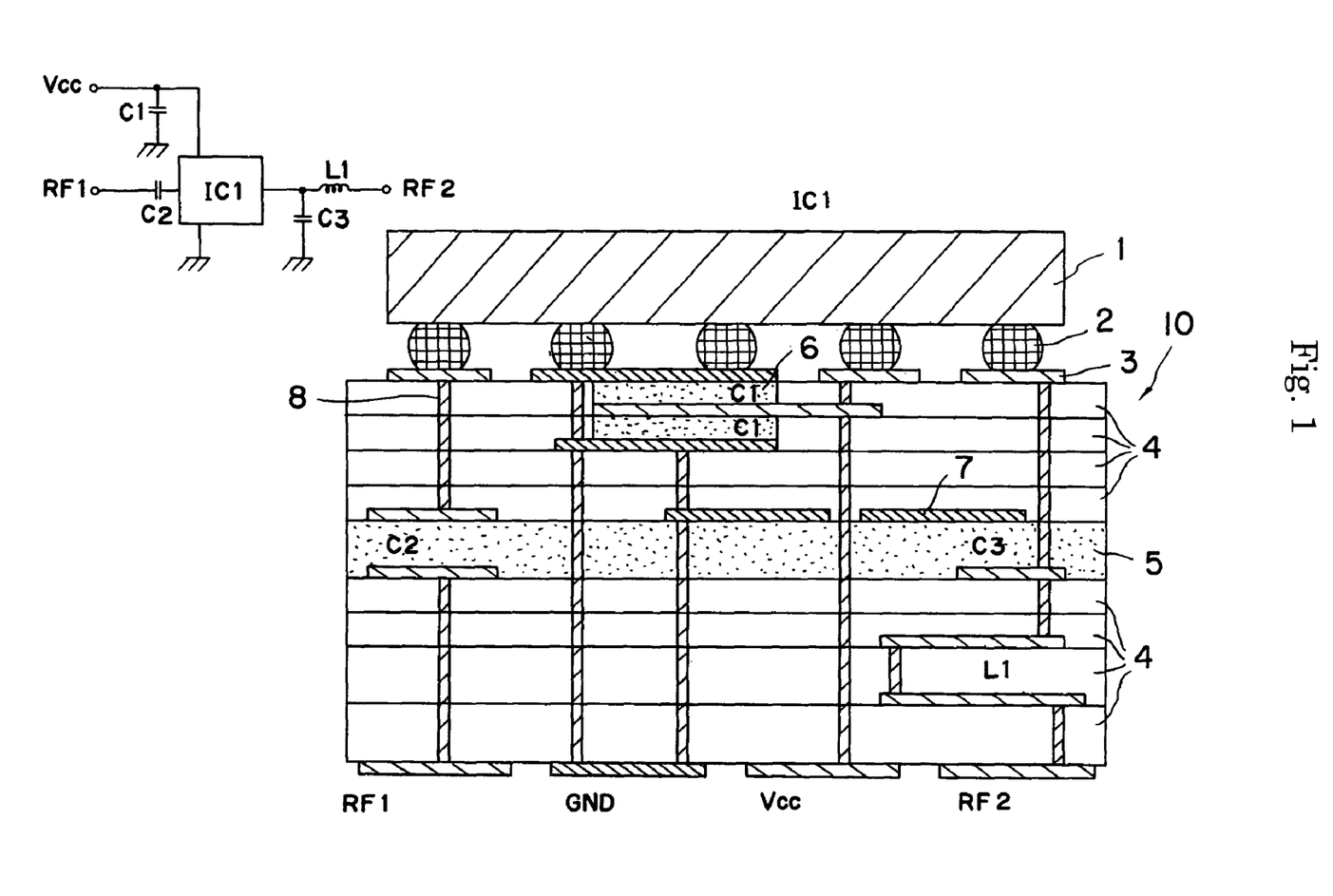
FIG. 1 is a schematic sectional view of an example of an electronic part to which the dielectric porcelain composition of the present invention may be applied.

FIG. 1 shows an example of an electronic part to which the present invention can be applied. The part shown in the drawing is a multilayer wiring board with built-in capacitor. An integrated circuit 1 is mounted on a multilayer wiring board 10 through an external electrode 3 and a solder bump 2. The multilayer wiring board 10 is composed of, for example, a porcelain 4 with low dielectric constant as described above and porcelains 5 and 6 with high dielectric constant of the dielectric porcelain composition of the present invention. According to an appropriate design, inner layer electrodes 7 and via conductors 8 are vertically and horizontally formed to constitute multilayer wiring. In this part 10, each of C1, C2 and C3 forms a capacitor, which can be used for each predetermined purpose.

EXAMPLES

Experiment A $BaCO_3$ and $TiO_2$ were weighted, wet-mixed while adding pure water thereto by a ball mill, and dried. The resulting dried product was powderized, calcined at 1100° C. for 2 hours in the atmosphere, and wet-pulverized so as to have an average particle size of about 1.0 μm to thereby obtain a barium titanate calcined powder.

Each powder of $Bi_2O_3$, CuO, ZnO and MgO was weighed as needed so as to have each composition shown in Tables 1 and 2, and added to the barium titanate powder. The mixture was wet-mixed by a ball mill for 15 hours, dried, and granulated while adding a proper amount of polyvinyl alcohol, and the resulting granulated product was molded at a pressure of about 1 ton/cm² to thereby obtain a disk-like molded body having a diameter of 12 mm and a thickness of 1.0 mm. The resulting molded body was mainly fired in the atmosphere at each temperature shown in Tables 1 and 2 to thereby prepare a dielectric porcelain sample of each example.

The bulk density, dielectric constant ($\epsilon$), and dielectric loss of each dielectric porcelain sample were measured. The results are summarized in Tables 1 and 2. The measurement methods are as follows.

(Bulk Density)

Archimedes method (Dielectric Constant) and (Dielectric Loss)

LCR Meter (1 kHz, 1 V)

TABLE 1

| Sample No. | Main Component BaTiO₃ | First sub-component (weight parts) | | | | Sub-Components Total (weight Parts) | Bi₂O₃:MeO Molar Ratio | Sintering Temperature ° C. | Bulk density (g/cm³) | Dielectric Constant $\epsilon$ | Dielectric Loss (%) |
|---|---|---|---|---|---|---|---|---|---|---|---|
| | | Bi₂O₃ | CuO | ZnO | MgO | | | | | | |
| A1 | 100 | 2.6 | 0.4 | | | 3.0 | 1:1 | 900 | 5.50 | 680 | 7.1 |
| A2 | 100 | 2.6 | 0.4 | | | 3.0 | 1:1 | 950 | 5.56 | 869 | 6.8 |
| A3 | 100 | 2.6 | 0.4 | | | 3.0 | 1:1 | 1000 | 5.60 | 921 | 6.1 |
| A4 | 100 | 3.4 | 0.6 | | | 4.0 | 1:1 | 900 | 5.63 | 1032 | 3.6 |

TABLE 1-continued

| Sample No. | Main Component BaTiO$_3$ | First sub-component (weight parts) | | | | Sub-Components Total (weight Parts) | Bi$_2$O$_3$:MeO Molar Ratio | Sintering Temperature °C. | Bulk density (g/cm$^3$) | Dielectric Constant ε | Dielectric Loss (%) |
|---|---|---|---|---|---|---|---|---|---|---|---|
| | | Bi$_2$O$_3$ | CuO | ZnO | MgO | | | | | | |
| A5  | 100 | 3.4  | 0.6 |     |     | 4.0  | 1:1 | 950  | 5.86 | 1058 | 3.2 |
| A6  | 100 | 3.4  | 0.6 |     |     | 4.0  | 1:1 | 1000 | 5.99 | 1185 | 3.8 |
| A7  | 100 | 5.1  | 0.9 |     |     | 6.0  | 1:1 | 850  |      | Not sintered | |
| A8  | 100 | 5.1  | 0.9 |     |     | 6.0  | 1:1 | 900  | 5.85 | 1121 | 2.9 |
| A9  | 100 | 5.1  | 0.9 |     |     | 6.0  | 1:1 | 950  | 5.90 | 1344 | 3.1 |
| A10 | 100 | 5.1  | 0.9 |     |     | 6.0  | 1:1 | 1000 | 5.92 | 1405 | 3.9 |
| A11 | 100 | 5.1  | 0.9 |     |     | 6.0  | 1:1 | 1050 | 5.96 | 1931 | 6.2 |
| A12 | 100 | 8.5  | 1.5 |     |     | 10.0 | 1:1 | 900  | 5.93 | 1145 | 3.4 |

TABLE 2

| Sample No. | Main Component BaTiO$_3$ | First sub-component (weight parts) | | | | First Sub-component Total (weight parts) | Bi$_2$O$_3$:MeO Molar ratio | Sintering Temperature (°C.) | Bulk Density (g/cm$^3$) | Dielectric Constant ε | Dielectric Loss (%) |
|---|---|---|---|---|---|---|---|---|---|---|---|
| | | Bi$_2$O$_3$ | CuO | ZnO | MgO | | | | | | |
| A13 | 100 | 8.5  | 1.5 |     |     | 10.0 | 1:1 | 950  | 5.95 | 1082 | 2.9 |
| A14 | 100 | 8.5  | 1.5 |     |     | 10.0 | 1:1 | 1000 | 5.91 | 1016 | 3.6 |
| A15 | 100 | 10.2 | 1.8 |     |     | 12.0 | 1:1 | 900  | 5.88 | 931  | 7.6 |
| A16 | 100 | 4.3  |     | 0.7 |     | 5.0  | 1:1 | 950  | 5.56 | 1135 | 1.9 |
| A17 | 100 | 4.3  |     | 0.7 |     | 5.0  | 1:1 | 1000 | 5.73 | 1451 | 2.6 |
| A18 | 100 | 8.5  |     | 1.5 |     | 10.0 | 1:1 | 950  | 5.72 | 1325 | 3.6 |
| A19 | 100 | 8.5  |     | 1.5 |     | 10.0 | 1:1 | 1000 | 5.83 | 1214 | 3.2 |
| A20 | 100 | 4.6  |     |     | 0.4 | 5.0  | 1:1 | 950  | 5.46 | 1089 | 2.1 |
| A21 | 100 | 4.6  |     |     | 0.4 | 5.0  | 1:1 | 1000 | 5.63 | 1023 | 3.8 |
| A22 | 100 | 9.2  |     |     | 0.8 | 10.0 | 1:1 | 950  | 5.59 | 1136 | 4.9 |
| A23 | 100 | 9.2  |     |     | 0.8 | 10.0 | 1:1 | 1000 | 5.66 | 1212 | 4.2 |

Samples A1, A2 and A3 in which the total amount of first sub-components was set to 3.0 parts by weight were low in dielectric constant and high in dielectric loss. In Samples A4, A5 and A6 in which the total amount of the first sub-components was set to 4.0 parts by weight, the dielectric loss was reduced with high dielectric constant. Sample A7 was not sintered although the sintering temperature was lowered to 850° C. Samples A8 to A10 in which the total amount of the first sub-components was set to 6.0 parts by weight, the dielectric constant was further increased with low dielectric loss. In Sample A11 in which the firing temperature was set to 1050° C., the dielectric constant was further improved. However, the dielectric loss was slightly reduced deteriorated. Samples A12, A13 and A14 in which the total amount of first sub-components was set to 10.0 parts by weight were high in dielectric constant and low in dielectric loss.

In Sample A15 in which the total amount of first sub-components was set to 12.0 parts by weight, the dielectric constant was reduced, and the dielectric loss was also deteriorated. Samples A16 to A19 in which ZnO was used instead of CuO were high in dielectric constant and low in dielectric loss. In Samples A20 to A23 in which MgO was used instead of CuO, the dielectric loss could be reduced with high dielectric constant. However, CuO and ZuO are seemed to be more preferred.

Experiment B

Porcelain of each composition shown in Table 3 was produced in the same manner as in Experiment A, and evaluated for each characteristic shown in Table 3. The total amount of the first sub-components and the composition ratio of bismuth oxide to the other oxide MeO in the first sub-components were varied as shown in Table 3.

TABLE 3

| Sample No. | Main Component BaTiO$_3$ | First sub-components (weight parts) | | | | First Sub-components Total (weight parts) | Bi$_2$O$_3$:MeO Molar ratio | Sintering Temperature (°C.) | Bulk Density (g/cm$^3$) | Dielectric Constant ε | Dielectric Loss (%) |
|---|---|---|---|---|---|---|---|---|---|---|---|
| | | Bi$_2$O$_3$ | CuO | ZnO | MgO | | | | | | |
| B1 | 100 | 4.5 | 1.5 | | | 6.0 | 1.0:2.0 | 920 | 5.30 | 778  | 10.1 |
| B2 | 100 | 4.8 | 1.2 | | | 6.0 | 1.0:1.5 | 920 | 5.77 | 1036 | 4.9 |
| B3 | 100 | 5.5 | 0.5 | | | 6.0 | 2.0:1.0 | 920 | 5.84 | 1164 | 4.2 |
| B4 | 100 | 5.8 | 0.2 | | | 6.0 | 5.0:1.0 | 920 | 5.48 | 1032 | 4.4 |
| B5 | 100 | 5.9 | 0.1 | | | 6.0 | 7.0:1.0 | 920 | 5.21 | 430  | 12.1 |
| B6 | 100 | 6.0 |     | | | 6.0 | —       | 980 | Not sintered | | |

TABLE 3-continued

| Sample No. | Main Component BaTiO$_3$ | First sub-components (weight parts) | | | | First Sub-components Total (weight parts) | Bi$_2$O$_3$:MeO Molar ratio | Sintering Temperature (°C.) | Bulk Density (g/cm$^3$) | Dielectric Constant ε | Dielectric Loss (%) |
|---|---|---|---|---|---|---|---|---|---|---|---|
| | | Bi$_2$O$_3$ | CuO | ZnO | MgO | | | | | | |
| B7  | 100 | 4.4 | 1.6 |     |     | 6.0 | 1.0:2.0 | 980 |      | Not sintered |     |
| B8  | 100 | 4.8 | 1.2 |     |     | 6.0 | 1.0:1.5 | 960 | 5.57 | 1221 | 3.6 |
| B9  | 100 | 5.1 | 0.9 |     |     | 6.0 | 2.0:1.0 | 960 | 5.81 | 1542 | 3.9 |
| B10 | 100 | 5.5 | 0.5 |     |     | 6.0 | 5.0:1.0 | 960 | 5.51 | 1158 | 4.1 |
| B11 | 100 | 5.8 | 0.2 |     |     | 6.0 | 7.0:1.0 | 980 |      | Not sintered |     |
| B12 | 100 | 5.1 |     | 0.9 |     | 6.0 | 1.0:2.0 | 980 |      | Not sintered |     |
| B13 | 100 | 5.3 |     | 0.7 |     | 6.0 | 1.0:1.5 | 980 | 5.41 | 1431 | 2.2 |
| B14 | 100 | 5.8 |     | 0.2 |     | 6.0 | 2.0:1.0 | 980 | 5.77 | 1551 | 2.8 |
| B15 | 100 | 5.9 |     | 0.1 |     | 6.0 | 5.0:1.0 | 980 | 5.38 | 1031 | 3.8 |

In Samples B 2 to B5, B 8 to B10, and B 13 to B15 in which the molar ratio of the total amount (MeO) of at least one compound selected from the group consisting of CuO, ZnO and MgO to Bi$_2$O$_3$ ranges from 1.5:1.0 to 1.0:5.0, each characteristic was particularly excellent.

Experiment C

Porcelain of each composition show in Tables 4 and 5 was produced in the same manner as in Experiment A, and evaluated for each characteristic shown in Table 4. As the main component, a part of BaTiO$_3$ was substituted by other components shown in Tables 4 and 5.

TABLE 4

| Sample No. | Main components (molar %) | | | | | First Sub-components (weight parts) | | First Sub-components Total (weight parts) | Sintering Temperature (°C.) | Bulk Density (g/cm$^3$) | Dielectric Constant ε | Dielectric Loss (%) |
|---|---|---|---|---|---|---|---|---|---|---|---|---|
| | BaTiO$_3$ | SrTiO$_3$ | CaTiO$_3$ | MgTiO$_3$ | BaZrO$_3$ | Bi$_2$O$_3$ | CuO | | | | | |
| C1  | 90 | 10 |   |   |   | 4.3 | 0.7 | 5.0 | 980 | 5.81 | 2263 | 3.1 |
| C2  | 80 | 10 |   |   |   | 5.1 | 0.9 | 6.0 | 940 | 5.89 | 2152 | 3.3 |
| C3  | 70 | 20 |   |   |   | 4.3 | 0.7 | 5.0 | 980 | 5.85 | 2981 | 3.3 |
| C4  | 90 | 20 |   |   |   | 5.1 | 0.9 | 6.0 | 940 | 5.87 | 2889 | 2.9 |
| C5  | 80 | 30 |   |   |   | 4.3 | 0.7 | 5.0 | 980 | 5.87 | 3851 | 3.4 |
| C6  | 70 | 30 |   |   |   | 5.1 | 0.9 | 6.0 | 940 | 5.81 | 3621 | 3.9 |
| C7  | 99 |    | 1 |   |   | 4.3 | 0.7 | 5.0 | 980 | 5.79 | 1522 | 1.3 |
| C8  | 99 |    | 1 |   |   | 5.1 | 0.9 | 6.0 | 940 | 5.77 | 1515 | 1.4 |
| C9  | 98 |    | 2 |   |   | 4.3 | 0.7 | 5.0 | 980 | 5.65 | 1321 | 1.5 |
| C10 | 98 |    | 2 |   |   | 5.1 | 0.9 | 6.0 | 940 | 5.71 | 1301 | 1.3 |
| C11 | 95 |    | 5 |   |   | 4.3 | 0.7 | 5.0 | 980 | 5.88 | 1288 | 1.3 |
| C12 | 95 |    | 5 |   |   | 5.1 | 0.9 | 6.0 | 940 | 5.99 | 1311 | 1.2 |

TABLE 5

| Sample No. | Main components (molar %) | | | | | First Sub-components (weight parts) | | First Sub-Components Total (weight parts) | Sintering Temperature (°C.) | Bulk Density (g/cm$^3$) | Dielectric Constant ε | Dielectric loss (%) |
|---|---|---|---|---|---|---|---|---|---|---|---|---|
| | BaTiO$_3$ | SrTiO$_3$ | CaTiO$_3$ | MgTiO$_3$ | BaZrO$_3$ | Bi$_2$O$_3$ | CuO | | | | | |
| C13 | 99 |   |   | 1  |   | 4.3 | 0.7 | 5.0 | 980 | 5.87 | 1941 | 2.0 |
| C14 | 99 |   |   | 1  |   | 5.1 | 0.9 | 6.0 | 940 | 5.98 | 1534 | 1.9 |
| C15 | 98 |   |   | 2  |   | 4.3 | 0.7 | 5.0 | 980 | 5.86 | 2037 | 1.9 |
| C16 | 98 |   |   | 2  |   | 5.1 | 0.9 | 6.0 | 940 | 5.85 | 1621 | 1.8 |
| C17 | 95 |   |   | 5  |   | 4.3 | 0.7 | 5.0 | 980 | 5.71 | 2213 | 2.1 |
| C18 | 95 |   |   | 5  |   | 5.1 | 0.9 | 6.0 | 940 | 5.73 | 1910 | 2.2 |
| C19 | 90 |   |   |    | 10 | 4.3 | 0.7 | 5.0 | 980 | 5.41 | 1856 | 3.6 |
| C20 | 90 |   |   |    | 10 | 5.1 | 0.9 | 6.0 | 940 | 5.89 | 1648 | 4.1 |
| C21 | 80 |   |   |    | 20 | 4.3 | 0.7 | 5.0 | 980 | 5.92 | 2431 | 4.6 |
| C22 | 80 |   |   |    | 20 | 5.1 | 0.9 | 6.0 | 940 | 5.77 | 2251 | 3.9 |
| C23 | 70 |   |   |    | 30 | 4.3 | 0.7 | 5.0 | 980 | 5.61 | 3982 | 4.4 |
| C24 | 70 |   |   |    | 30 | 5.1 | 0.9 | 6.0 | 940 | 5.66 | 3880 | 3.9 |

Consequently, in also Samples C1 to C24, low-temperature firing could be performed by adding predetermined amounts of the first sub-components according to the present invention, and the dielectric constant of the porcelain could be increased to reduce the dielectric loss.

Experiment D

Porcelain of each composition shown in Table 6 was produced in the same manner as in Experiment A, and evaluated for each characteristic shown in Tables 6 and 7. Second sub-components were added in amounts shown in Table 6 while fixing the total amount of the first sub-components to 5.0 or 6.0 parts by weight.

The electrostatic capacitance of the porcelains was measured as follows. The difference between maximum value and minimum value of the electrostatic capacitance in each designated temperature range is shown in Table 7. "X7R" and "B" represent the degrees of satisfaction for X7R characteristic of EIA standard and B characteristic of JIS standard, respectively, with "○" showing that the standards are satisfied and "X" showing that the standards are unsatisfied.

TABLE 6

| No. | Main Component BaTiO$_3$ | First Sub-Components (weight Parts) Bi$_2$O$_3$ | CuO | ZnO | First Sub-Component Total Weight Parts | Second Sub-Components (weight Parts) Nb$_2$O$_5$ | MnO | Second Sub-components Total Weight Parts | Sintering Temperature °C. | Bulk Density g/cm$^3$ | Dielectric Constant ε | Dielectric Loss (%) |
|---|---|---|---|---|---|---|---|---|---|---|---|---|
| D1 | 100 | 4.3 | 0.7 | 0.2 | 5.2 | | | 0.2 | 960 | 5.55 | 1581 | 1.3 |
| D2 | 100 | 4.3 | 0.7 | 0.5 | 5.5 | | | 0.5 | 960 | 5.89 | 1989 | 1.1 |
| D3 | 100 | 4.3 | 0.7 | 0.8 | 5.8 | | | 0.8 | 960 | 5.85 | 1972 | 1.3 |
| D4 | 100 | 4.3 | 0.7 | 1 | 6.0 | | | 1.0 | 960 | 5.87 | 1921 | 0.9 |
| D5 | 100 | 4.3 | 0.7 | 1.2 | 6.2 | | | 1.2 | 960 | 5.79 | 1968 | 1 |
| D6 | 100 | 4.3 | 0.7 | | 5.0 | 0.2 | | 0.2 | 960 | 5.68 | 1522 | 2.8 |
| D7 | 100 | 4.3 | 0.7 | 0.4 | 5.4 | | 0.1 | 0.5 | 960 | 5.96 | 1301 | 0.7 |
| D8 | 100 | 4.3 | 0.7 | 0.2 | 5.2 | | 0.3 | 0.5 | 960 | 5.88 | 1288 | 0.6 |
| D9 | 100 | 5.1 | 0.9 | 0.2 | 6.2 | | | 0.2 | 930 | 5.99 | 2521 | 0.7 |
| D10 | 100 | 5.1 | 0.9 | 0.5 | 6.5 | | | 0.5 | 930 | 5.87 | 2640 | 0.9 |
| D11 | 100 | 5.1 | 0.9 | 0.8 | 6.8 | | | 0.8 | 930 | 5.98 | 2621 | 1 |
| D12 | 100 | 5.1 | 0.9 | 1 | 7.0 | | | 1.0 | 930 | 5.86 | 2699 | 0.8 |
| D13 | 100 | 5.1 | 0.9 | 1.2 | 7.2 | | | 1.2 | 930 | 5.85 | 2683 | 0.7 |
| D14 | 100 | 5.1 | 0.9 | | 6.0 | 0.2 | | 0.2 | 930 | 5.73 | 1836 | 2.9 |
| D15 | 100 | 5.1 | 0.9 | | 6.0 | 0.5 | | 0.5 | 930 | 5.41 | 1856 | 2.1 |
| D16 | 100 | 5.1 | 0.9 | 0.2 | 6.2 | | 0.3 | 0.5 | 930 | 5.87 | 1698 | 0.5 |

TABLE 7

| Sample No. | Temperature-dependency of electrostatic capacity | | | | | |
|---|---|---|---|---|---|---|
| | ΔC (−55° C./25° C.) | ΔC (125° C./25° C.) | X7R | ΔC (−25° C./20° C.) | ΔC (85° C./20° C.) | B |
| D1 | −22.0 | +0.02 | X | −9.3 | +6.2 | ○ |
| D2 | −14.3 | −6.8 | ○ | −8.5 | −1.3 | ○ |
| D3 | −13.9 | −7.9 | ○ | −8.2 | −2.8 | ○ |
| D4 | −13.3 | −12.5 | ○ | −8.4 | −4.5 | ○ |
| D5 | −14.1 | −14.3 | ○ | −7.7 | −5.8 | ○ |
| D6 | −14.7 | +10.8 | ○ | −8.9 | +9.9 | ○ |
| D7 | −14.3 | +20.6 | X | −6.9 | +9.5 | ○ |
| D8 | −14.4 | +14.3 | ○ | −7.1 | +5.1 | ○ |
| D9 | −20.8 | −2.8 | X | −7.5 | +0.1 | ○ |
| D10 | −13.2 | −4.1 | ○ | −3.9 | −4.8 | ○ |
| D11 | −12.6 | −10.9 | ○ | −0.2 | −4.4 | ○ |
| D12 | −9.6 | −13.9 | ○ | +0.6 | −5.8 | ○ |
| D13 | −8.3 | −14.8 | ○ | +0.9 | −8.7 | ○ |
| D14 | −20.9 | +25.2 | X | −8.6 | +9.7 | ○ |
| D15 | −13.2 | +1.8 | ○ | −7.2 | +7.9 | ○ |
| D16 | −13.8 | +13.1 | ○ | −8.9 | +5.9 | ○ |

In each of Samples D1 to D16, low-temperature firing could be performed, and the dielectric loss of porcelain could be remarkably reduced with high dielectric constant. Further, it was found that the temperature change rate of electrostatic capacitance of the porcelain can be reduced to satisfy the X7R characteristic of EIA standard and the B characteristic of JIS standard.

Experiment E-A

Porcelain of each composition shown in Table 8 was produced in the same manner as in Experiment A. The piezoelectricity measuring sample was formed to have a dimension after sintering of 12 mm (length)×3 mm (width)×1 mm (thickness). Measurement of bulk density, dielectric constant ($\in$) and dielectric loss was performed to the porcelain of each example. The results are summarized in Table 8. Further, whether the porcelain could be polarized or not was also examined. The poling was performed by applying an electric field of 2 to 2.5 kV/mm in silicone oil of 70° C. for 15 minutes.

Sample E5 was not sintered because the firing temperature was as low as 850° C. Sample E9 was found not to be polable although the dielectric constant was increased with a firing temperature of 1050° C. Accordingly, polable compact dielectric porcelain with high dielectric constant that is a sintered body of barium titanate-based porcelain composition in a low-temperature area of 1000° C. or lower is provided first by the present invention.

Experiment E-B

Dielectric porcelain of each composition shown in Tables 9, 10 and 11 was produced in the same manner as in Experiment A. In Experiments E12 to E29, MnO was added in each amount shown in Tables 9 and 10. In Experiments E 30 to E41, $Li_2CO_3$ was added in each amount shown in Table 11. Each characteristic was measured as follows.

(Density, Dielectric Constant, Dielectric Loss)
 According to Experiment A (Electromechanical Coupling Factor $k_{31}$, Piezoelectric Constant $d_{31}$, Mechanical Quality Factor Qm)

Resonance-antiresonance method

TABLE 8

| | Main component | sub-component (weight parts) | | total sub-components | $Bi_2O_3$:CuO Molar | Sintering temperature | Density | Dielectric Constant | Dielectric Loss tanδ | |
|---|---|---|---|---|---|---|---|---|---|---|
| | $BaTiO_3$ | $Bi_2O_3$ | CuO | Weight parts | Ratio | ° C. | (g/cm³) | $\in$ | (%) | Polarization |
| E1 | 100 | 2.6 | 0.4 | 3.0 | 1:1 | 900 | 5.50 | 680 | 7.1 | X |
| E2 | 100 | 2.6 | 0.4 | 3.0 | 1:1 | 950 | 5.56 | 869 | 6.8 | X |
| E3 | 100 | 3.4 | 0.6 | 4.0 | 1:1 | 900 | 5.63 | 1032 | 3.6 | ○ |
| E4 | 100 | 3.4 | 0.6 | 4.0 | 1:1 | 950 | 5.86 | 1058 | 3.2 | ○ |
| E5 | 100 | 5.1 | 0.9 | 6.0 | 1:1 | 850 | | Not sintered | | X |
| E6 | 100 | 5.1 | 0.9 | 6.0 | 1:1 | 900 | 5.85 | 1121 | 2.9 | ○ |
| E7 | 100 | 5.1 | 0.9 | 6.0 | 1:1 | 950 | 5.90 | 1344 | 3.1 | ○ |
| E8 | 100 | 5.1 | 0.9 | 6.0 | 1:1 | 1000 | 5.92 | 1405 | 3.9 | ○ |
| E9 | 100 | 5.1 | 0.9 | 6.0 | 1:1 | 1050 | 5.96 | 1931 | 6.2 | X |
| E10 | 100 | 8.5 | 1.5 | 10.0 | 1:1 | 950 | 5.95 | 1082 | 2.9 | ○ |
| E11 | 100 | 10.2 | 1.8 | 12.0 | 1:1 | 900 | 5.88 | 984 | 7.6 | X |

TABLE 9

| | Main Component | Sub-Component (weight Parts) | | $Bi_2O_3$:CuO Molar Ratio | MnO Weight Parts | Sintering Temperature | Density | Dielectric Constant | Dielectric Loss tan δ | Electromechanical Coupling Factor ($k_{31}$) | Piezoelectric Constant ($d_{31}$) | Mechanical quality Constant |
|---|---|---|---|---|---|---|---|---|---|---|---|---|
| | $BaTiO_3$ | $Bi_2O_3$ | CuO | Ratio | Parts | ° C. | (g/cm³) | $\in$ | (%) | (%) | ($10^{-12}$ m/V) | (Qm) |
| E6 | 100 | 5.1 | 0.9 | 1:1 | | 900 | 5.85 | 1121 | 2.9 | 2.8 | 8.7 | 195 |
| E7 | 100 | 5.1 | 0.9 | 1:1 | | 950 | 5.90 | 1344 | 3.1 | 3.7 | 13.0 | 85 |
| E8 | 100 | 5.1 | 0.9 | 1:1 | | 1000 | 5.92 | 1405 | 3.9 | 5.2 | 17.8 | 44 |
| E12 | 100 | 5.1 | 0.9 | 1:1 | 0.02 | 900 | 5.88 | 911 | 1.5 | 4.0 | 10.1 | 298 |
| E13 | 100 | 5.1 | 0.9 | 1:1 | 0.02 | 920 | 5.86 | 920 | 3.5 | 3.1 | 17.7 | 232 |
| E14 | 100 | 5.1 | 0.9 | 1:1 | 0.02 | 940 | 5.92 | 921 | 2.5 | 2.8 | 16.9 | 298 |
| E15 | 100 | 4.3 | 0.7 | 1:1 | 0.02 | 960 | 5.91 | 937 | 3.5 | 3.4 | 18.3 | 201 |
| E16 | 100 | 4.3 | 0.7 | 1:1 | 0.02 | 980 | 5.91 | 984 | 2.5 | 2.8 | 16.9 | 279 |
| E17 | 100 | 4.3 | 0.7 | 1:1 | 0.02 | 1000 | 5.94 | 921 | 3.1 | 4.8 | 16.4 | 298 |
| E18 | 100 | 5.1 | 0.9 | 1:1 | 0.1 | 900 | 5.89 | 1398 | 3.7 | 5.6 | 18.9 | 131 |
| E19 | 100 | 5.1 | 0.9 | 1:1 | 0.1 | 920 | 5.87 | 1395 | 3.2 | 6.9 | 19.7 | 109 |
| E20 | 100 | 5.1 | 0.9 | 1:1 | 0.1 | 940 | 5.88 | 1336 | 3.1 | 7.6 | 18.0 | 136 |

TABLE 10

| | Main Component | Sub-Component (weight Parts) | | Bi$_2$O$_3$:CuO Molar Ratio | MnO Weight Parts | Sintering Temperature °C. | Density (g/cm$^3$) | Dielectric Constant ε | Dielectric Loss tan δ (%) | Electro-mechanical Coupling Factor (k$_{31}$) (%) | Pizoelectric Constant (d$_{31}$) (10$^{-12}$ m/V) | Mechanical quality Constant (Qm) |
|---|---|---|---|---|---|---|---|---|---|---|---|---|
| | BaTiO$_3$ | Bi$_2$O$_3$ | CuO | | | | | | | | | |
| E21 | 100 | 4.3 | 0.7 | 1:1 | 0.1 | 960 | 5.93 | 1304 | 3.9 | 7.8 | 19.1 | 117 |
| E22 | 100 | 4.3 | 0.7 | 1:1 | 0.1 | 980 | 5.94 | 1273 | 3.6 | 8.1 | 19.6 | 102 |
| E23 | 100 | 4.3 | 0.7 | 1:1 | 0.1 | 1000 | 5.93 | 1116 | 3.1 | 8.2 | 19.2 | 102 |
| E24 | 100 | 5.1 | 0.9 | 1:1 | 0.15 | 900 | 5.97 | 1430 | 5.7 | 3.6 | 8.9 | 71 |
| E25 | 100 | 5.1 | 0.9 | 1:1 | 0.2 | 900 | 5.99 | 1552 | 6.2 | 2.9 | 10.1 | 70 |
| E26 | 100 | 5.1 | 0.9 | 1:1 | 0.15 | 940 | 5.97 | 1496 | 5.1 | 3.6 | 8.4 | 70 |
| E27 | 100 | 5.1 | 0.9 | 1:1 | 0.2 | 940 | 5.98 | 1430 | 6.9 | 2.8 | 9.4 | 61 |
| E28 | 100 | 5.1 | 0.9 | 1:1 | 0.15 | 1000 | 5.94 | 1304 | 5.6 | 4.1 | 9.7 | 40 |
| E29 | 100 | 5.1 | 0.9 | 1:1 | 0.2 | 1000 | 5.93 | 1336 | 6.1 | 3.2 | 10.1 | 49 |

TABLE 11

| | Main Component | Sub-Component (weight Parts) | | Bi$_2$O$_3$:CuO Molar Ratio | MnO Weight Parts | Sintering Temperature °C. | Density (g/cm$^3$) | Dielectric Constant ε | Dielectric Loss tan δ (%) | Electro-mechanical Coupling Factor (k$_{31}$) (%) | Pizoelectric Constant (d$_{31}$) (10$^{-12}$ m/V) | Mechanical quality Constant (Qm) |
|---|---|---|---|---|---|---|---|---|---|---|---|---|
| | BaTiO$_3$ | Bi$_2$O$_3$ | CuO | | | | | | | | | |
| E30 | 100 | 5.1 | 0.9 | 1:1 | 0.05 | 900 | 5.98 | 890 | 0.6 | 8.1 | 16.9 | 279 |
| E31 | 100 | 5.1 | 0.9 | 1:1 | 0.1 | 900 | 5.98 | 838 | 0.6 | 12.1 | 24.8 | 216 |
| E32 | 100 | 5.1 | 0.9 | 1:1 | 0.05 | 940 | 5.99 | 822 | 1.5 | 13.6 | 25.7 | 201 |
| E33 | 100 | 4.3 | 0.7 | 1:1 | 0.1 | 940 | 5.95 | 835 | 1.6 | 14.4 | 27.7 | 174 |
| E34 | 100 | 4.3 | 0.7 | 1:1 | 0.05 | 1000 | 5.94 | 869 | 1.8 | 14.0 | 29.7 | 151 |
| E35 | 100 | 4.3 | 0.7 | 1:1 | 0.1 | 1000 | 5.99 | 834 | 1.5 | 14.6 | 30.0 | 169 |
| E36 | 100 | 5.1 | 0.9 | 1:1 | 0.2 | 900 | 5.91 | 1203 | 6.6 | 6.2 | 17.2 | 272 |
| E37 | 100 | 5.1 | 0.9 | 1:1 | 0.3 | 900 | 5.96 | 1029 | 7.8 | 4.7 | 11.6 | 333 |
| E38 | 100 | 5.1 | 0.9 | 1:1 | 0.2 | 940 | 5.95 | 1136 | 6.5 | 7.3 | 19.0 | 373 |
| E39 | 100 | 4.3 | 0.7 | 1:1 | 0.3 | 940 | 5.97 | 1148 | 7.6 | 7.1 | 18.9 | 369 |
| E40 | 100 | 4.3 | 0.7 | 1:1 | 0.2 | 1000 | 5.96 | 1183 | 6.8 | 8.0 | 21.0 | 358 |
| E41 | 100 | 4.3 | 0.7 | 1:1 | 0.3 | 1000 | 5.99 | 1148 | 7.5 | 7.2 | 19.3 | 302 |

As is apparent from Tables 9, 10 and 11, the dielectric porcelain composition of the present invention can provide compact porcelains which show relatively high dielectric constant by firing in a low temperature area of 900 to 1000° C. Further, a piezoelectric constant of an unprecedented high level can be ensured as lead-free porcelain obtained by firing at 1000° C. or lower.

It was found from Samples E12 to E29 that the piezoelectric constant can be further enhanced by controlling the ratio of MnO to 0.1 part by weight or less.

Further, it was found from Samples E30 to E41 that the piezoelectric constant can be further enhanced by controlling the ratio of Li$_2$CO$_3$ to 0.05 to 0.10 part by weight.

While specific preferred embodiments have been shown and described, the present invention is never limited by these specific embodiments, and can be carried out with various modifications and substitutions without departing from the scope of the claims thereof.

The invention claimed is:

1. A dielectric porcelain composition comprising (A) 100 parts by weight of a barium titanate-based dielectric material selected from the group consisting of (i) barium titanate, (ii) barium titanate with up to 30 mol % of the barium substituted by one of strontium, calcium and magnesium, (iii) barium titanate with up to 30 mol % of the titanium substituted by zirconium, and (iv) barium titanate with up to 30 mol % of the barium substituted by one of strontium, calcium and magnesium, and with up to 30 mol % of the titanium substituted by zirconium, and (B) 4 to 10 parts by weight in total of Bi$_2$O$_3$ and as sub-components, wherein the molar ratio of CuO to Bi$_2$O$_3$ ranges from 1.5:1.0 to 1.0:5.0.

2. The dielectric porcelain composition of claim 1, wherein the composition is sintered at a temperature of 900 to 1000° C.

3. The dielectric porcelain composition of claim 1, further comprising 0 to 30 mol % of at least one component selected from the group consisting of SrTiO$_3$, CaTiO$_3$, MgTiO$_3$ and BaZrO$_3$.

4. The dielectric porcelain composition of claim 1, further comprising at least one component selected from the group consisting of Nb$_2$O$_5$ and MnO in an amount of 0.1 part by weight or more and 1.5 parts by weight or less.

5. The dielectric porcelain composition of claim 1, having a dielectric constant at 25° C. of 1000 to 4000 and a dielectric loss at 25° C. of 5% or less.

6. The dielectric porcelain composition of claim 1, further comprising, as the sub-components, at least one of ZnO and MgO, wherein the molar ratio of the total amount of CuO and at least one component selected from the group consisting of ZnO and MgO to Bi$_2$O$_3$ ranges from 1.5:1.0 to 1.0:5.0.

7. The dielectric porcelain composition of claim 1, further comprising MnO in an amount of 0.02 part by weight or more and 0.2 part by weight or less.

8. The dielectric porcelain composition of claim 1, further comprising lithium in an amount of 0.05 part by weight or more and 0.3 part by weight or less in terms of Li$_2$CO$_3$.

9. An electronic part comprising the dielectric porcelain composition of claim 1.

10. The electronic part of claim 9, further comprising a conductive film comprising a material selected from the group consisting of Ag, Cu and Ag—Pd alloy.

11. The dielectric porcelain composition of claim 1, wherein the composition is substantially free of a glass component.

* * * * *

UNITED STATES PATENT AND TRADEMARK OFFICE
CERTIFICATE OF CORRECTION

PATENT NO. : 7,781,360 B2
APPLICATION NO. : 12/204006
DATED : August 24, 2010
INVENTOR(S) : Tomoyuki Hasegawa, Yoshinori Ide and Tadashi Otagiri It is certified that error appears in the above-identified patent and that said Letters Patent is hereby corrected as shown below:

Column 7

*Line 49*: please delete "reduced"

Columns 15 and 16

*Sixth Column of Table 11*: please change "MnO Weight Parts" to --$Li_2CO_3$ Weight Parts--

Signed and Sealed this
Fifth Day of July, 2011

David J. Kappos
*Director of the United States Patent and Trademark Office*